United States Patent [19]
Okita

[11] Patent Number: 5,942,779
[45] Date of Patent: *Aug. 24, 1999

[54] REDUCED-COST, FLASH MEMORY ELEMENT AND MEMORY APPARATUS

[75] Inventor: Akira Okita, Yamato, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/599,378

[22] Filed: Feb. 9, 1996

[30] Foreign Application Priority Data

Feb. 14, 1995 [JP] Japan .................................. 7-025392

[51] Int. Cl.⁶ .............................................. H01L 29/788
[52] U.S. Cl. .............................................. 257/315
[58] Field of Search ..................................... 257/315

[56] References Cited

U.S. PATENT DOCUMENTS

| | | | |
|---|---|---|---|
| 4,146,902 | 3/1979 | Tanimoto et al. | ............................ 357/6 |
| 4,794,565 | 12/1988 | Wu et al. . | |
| 5,057,447 | 10/1991 | Paterson . | |
| 5,331,197 | 7/1994 | Miyawaki et al. | ........................ 257/530 |
| 5,365,094 | 11/1994 | Takasu | ..................................... 257/295 |

FOREIGN PATENT DOCUMENTS

| | | |
|---|---|---|
| 0500034 | 8/1992 | European Pat. Off. . |
| 0510607 | 10/1992 | European Pat. Off. . |
| 520825 | 12/1992 | European Pat. Off. . |
| 0550404 | 7/1993 | European Pat. Off. . |
| 0682370 | 11/1995 | European Pat. Off. . |
| 62-49651 | 3/1987 | Japan . |
| 62-188260 | 8/1987 | Japan . |
| 4-186797 | 7/1992 | Japan . |

OTHER PUBLICATIONS

Patent Abstracts of Japan, vol. 001, No. 050 (E–020), May 16, 1977 & JP–A–51 147135 (NEC Corp.) Dec. 17, 1976.

*Primary Examiner*—Stephen D. Meier
*Attorney, Agent, or Firm*—Fitzpatrick, Cella, Harper & Scinto

[57] ABSTRACT

A memory apparatus has, on a substrate, a first semiconductor region of one conduction type, second and third semiconductor regions of a conduction type opposite to the one conduction type in contact with the first semiconductor region, a first electrode provided above, and spaced by an insulating layer from, a region separating the second semiconductor region and the third semiconductor region, and a second electrode provided above, and spaced by an insulating layer from, the first electrode. At a side face of the first electrode, a resistance between the first electrode and the second electrode is arranged to change from a high-resistance state into a low-resistance state, thereby realizing large capacitance, low cost, capability of writing, quick writing and reading, high reliability, low dissipation power, and so on.

53 Claims, 13 Drawing Sheets

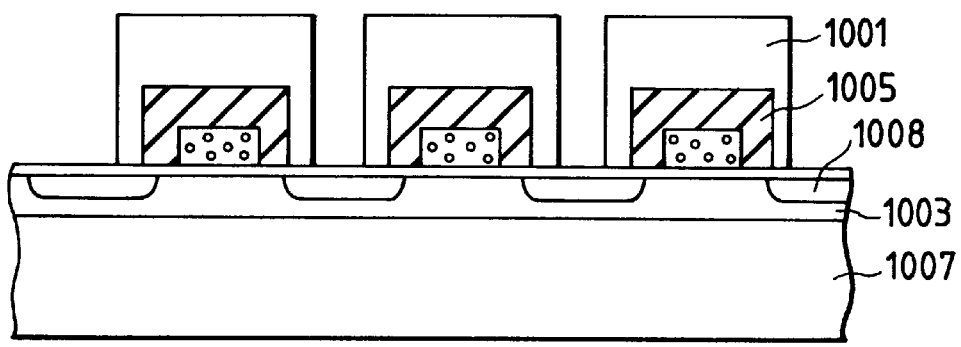
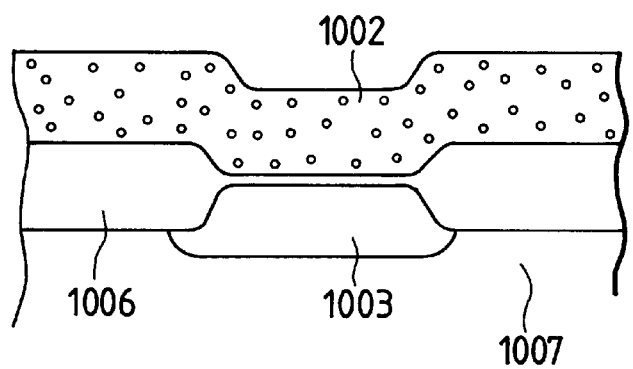
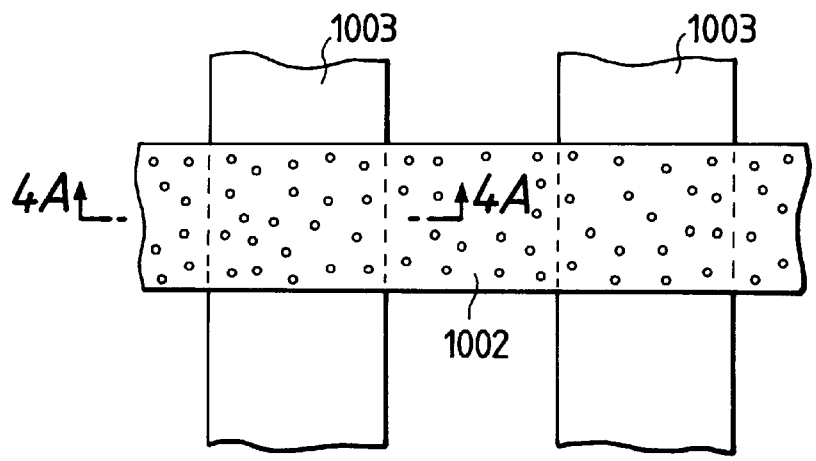

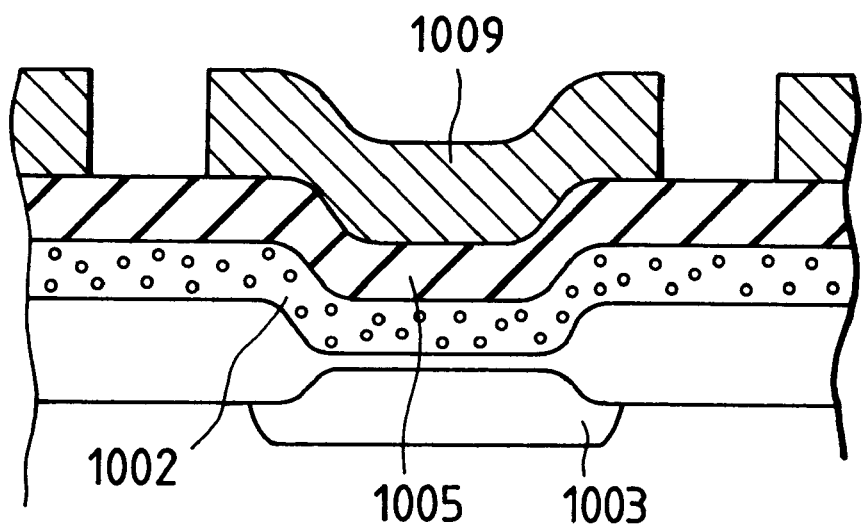
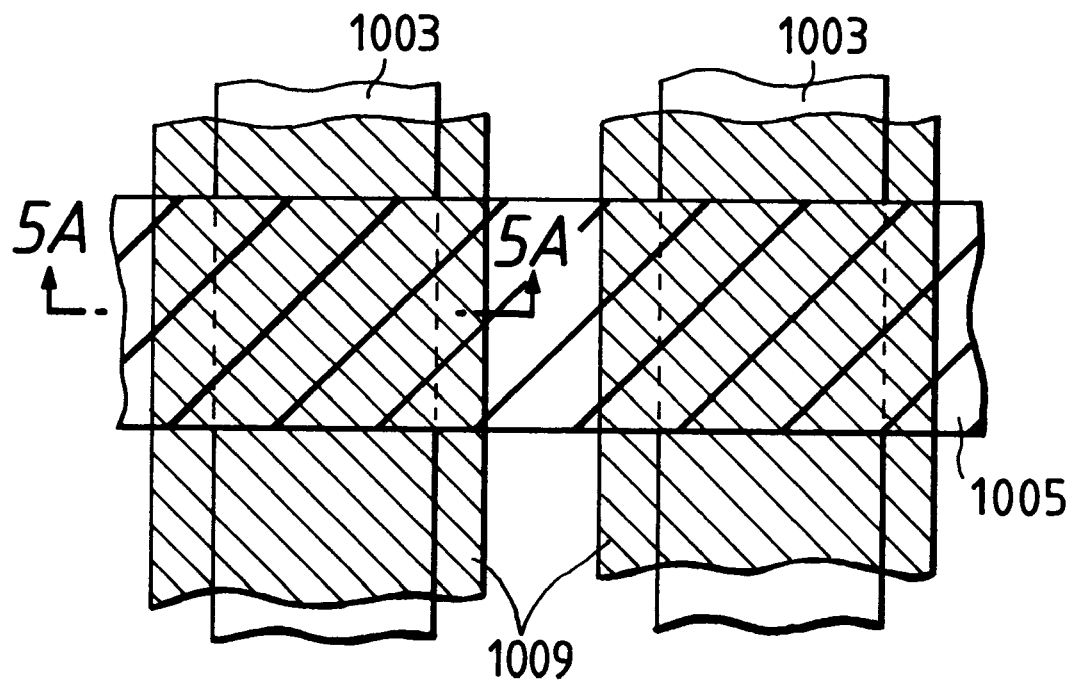

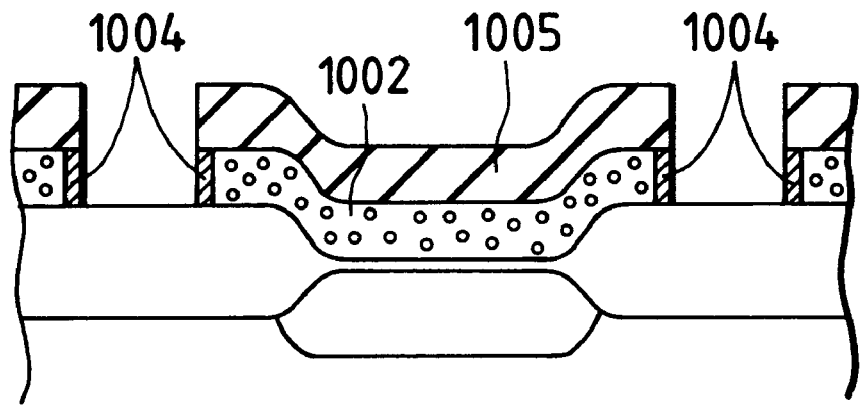
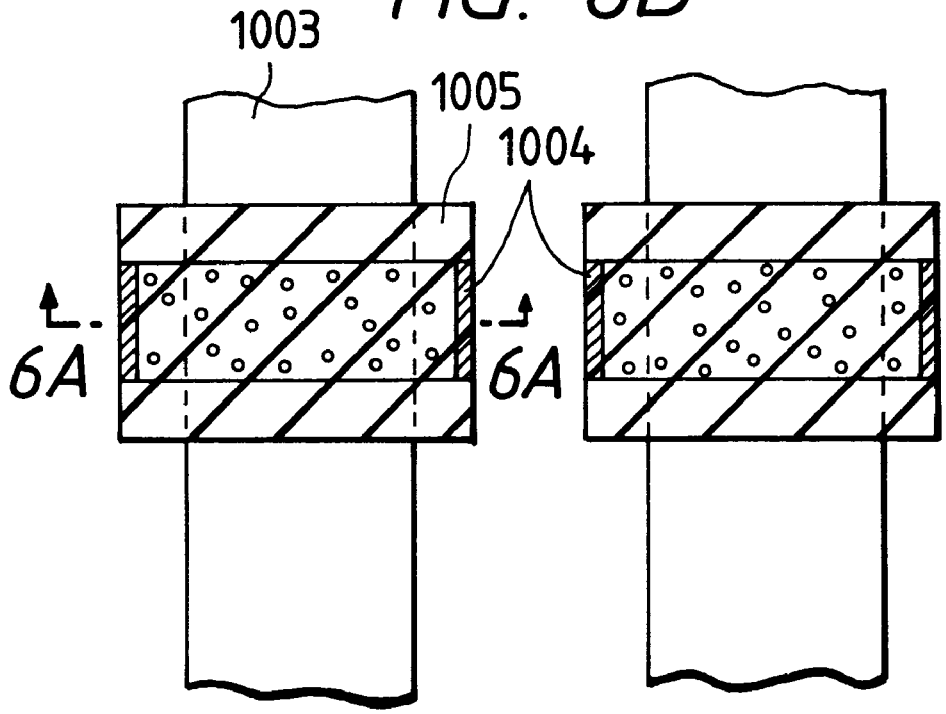

REDUCED-COST, FLASH MEMORY ELEMENT AND MEMORY APPARATUS

BACKGROUND OF THE INVENTION

1. Field of the Invention

The present invention concerns memory apparatus, and more particularly, the invention relates to memory apparatus using semiconductors.

2. Related Background Art

With the development of information and video industries, media and apparatus for storing information have vigorously been developed these last years. Among others, memory apparatus utilizing semiconductors, such as DRAM (Dynamic Random Access read/write Memory) and SRAM (Static Random Access read/write Memory), are applied to devices in many fields, because they have large memory capacities though compact in size, light in weight, and low in operation power and because they permit high-accuracy memory and can be read at high speed.

Further, attention has recently been drawn to a type of programmable and information-retainable memory apparatus popularly called "flash memory". It is pointed out that this memory apparatus can be improved more in respect of degree of integration than the above DRAM.

Further, OT-PROM (one time PROM (Programmable Read-Only Memory)), which permits only one writing, different from the flash memory, is proposed in Japanese Laid-Open Patent Application No. 62-188260 and Japanese Laid-Open Patent Application No. 62-49651 corresponding to U.S. Ser. No. 749,082 filed Jun. 25, 1985). In the structures disclosed in these applications, a wiring metal is connected in series with the main electrode (the source or the drain in the case of a MOSFET (Metal Oxide Semiconductor Field Effect Transistor) or the emitter in the case of a bipolar transistor) of a transistor through a Si region the crystal structure of which is destroyed, or through an a-Si layer. Storage operation Is carried out by changing the Si region or the a-Si layer from a high-resistance state into a low-resistance state.

However, the memory apparatus using semiconductors, such as DRAM, has the following matters desired to be improved.

1. The semiconductor memory apparatus represented by DRAM and SRAM increases an increase rate of chip cost with an increase in memory capacity and has a higher bit cost than floppy disks, magnetic tapes, and CD-ROM. Therefore, the semiconductor memory apparatus is not available for practical and easy use as a memory medium yet.

2. The current level of memory capacity under research and development is the 256 M-bit level, which is an insufficient information amount to actually handle images.

3. For storing information in DRAM or SRAM, a power supply is necessary, and thus, for example, applications to portable devices include a difficult aspect, considering the need to secure the power supply. At present a built-in battery is used in such applications in addition to a battery for driving device.

As for the flash memory, superior in respect of the degree of integration to the above DRAM, etc., the following matters are desired to be improved:

1. Since the FN tunnel current or hot electron injection, etc., is used for writing or erasing a charge in a floating gate, reliability of an insulating layer for input and output of charge will be degraded with an increase of the number of usage times.

2. FN tunnel current density J is expressed by the following equation when an electric field applied to the above insulating layer is E:

$$J=\alpha E^2 exp(-\beta/E) \tag{1}$$

In the equation, a and B are constants.

From Eq. (1), a large current flows when the intensity of the electric field is high. The electric current exponentially decreases with a change of the potential of the floating gate described above. Thus, writing period and erasing period per bit are long, about 100 $\mu$s to 10 ms, thus degrading operability of the memory apparatus.

3. The above FN tunnel current strongly depends upon the quality and the thickness of the above insulating layer, and thus, there is the problem of variations in suitable writing periods and erasing periods between samples or between bits. For this reason, actual practice is to classify memory chips into a plurality of groups at a checking step after fabrication of the chips and to operate the memories at suitable timings for the respective groups. This results in a great deal of extra work in the checking step, which tends to increase the cost.

4. The area of the above floating gate decreases with an increase of the capacity. This decreases the capacitance of the floating gate in proportion, so that even a little leakage current may cause a great change in the floating gate potential. Therefore, there is a limit on the permissible decrease in the area of the floating gate in order to ensure a desired capacitance, which is a governing factor in increasing the storage capacity.

Further, the above OT-PROM permitting only one-time writing is excellent in properties of keeping states after writing permanently unchanged and stabilized, but it requires, for example, an a-Si layer and a contact region between the a-Si layer and wiring for every bit. In the semiconductor process formation of contact holes is more difficult than formation of linear patterns. The contact size, if using the 0.8 $\mu$m rule process, is in the level of 1 $\mu m^2$ (1 $\mu$m×1 $\mu$m), up to about 20 percent more than. Since the wiring width needs to be increased more as compared with the contact holes, the desired decrease in the area per bit cannot be achieved. It thus becomes difficult to increase the memory capacity with these memories which have been proposed. Further, because a large current flows in the above a-Si layer in writing operation, dissipation power is high and applications to portable devices are difficult, which were the points desired to be improved.

SUMMARY OF THE INVENTION

It is an object of the present invention to provide a memory apparatus which can realize large capacity, low cost, writing capability, high writing speed and reading speed, high reliability, and low dissipation power, solving the technical problems described above.

It is another object of the present invention to provide a memory apparatus in which a cell area for each bit is small, which is available at low cost, and in which information written is permanent and stable.

It is a further object of the present invention to provide a memory apparatus which operates at low dissipation power and at low voltage, which can retain memory without a power supply such as a battery, and which has high reliability.

It is an additional object of the present invention to provide a memory apparatus which can be driven by an easy drive method, which permits high-speed writing, which permits high-speed reading, which operates at low error rate, which has less limitations on the operational environment of apparatus, and which is excellent in operability.

It is a further object of the present invention to provide a memory apparatus which can be fabricated in a lesser number of fabrication steps, which can be fabricated at high yield, which permits peripheral circuits, including devices and circuits constituting a memory apparatus of another type, logic circuits, etc., to be integrated on a same chip, and which permits high-functional design of chip.

It is still another object of the present invention to provide a memory apparatus which can be used not only as a memory apparatus for a computer, but also as an information memory medium for other purposes, for example for audio or video data, and which can replace the audio tapes, video tapes, CD-ROM, etc., commercially available at present, utilizing the above high-performance characteristics.

It is still another object of the present invention to provide a memory apparatus which can also be suitably applicable to systems permitting a user to carry or to extract and store necessary data such as video data in an easy fashion by writing in a recording medium such as a card having the memory apparatus of the present invention outputs from external memory apparatus in portable devices, electronic publishing, control apparatus, and electronic video and image memories, for example from still videos, facsimile devices, and copiers.

It is one aspect of the present invention to provide a memory apparatus having a memory element comprising, on a substrate, a first semiconductor region of one conduction type, second and third semiconductor regions of a conduction type opposite to the one conduction type in contact with the first semiconductor region, a first electrode provided above, and spaced by an insulating layer from, a region for separating the second semiconductor region and the third semiconductor region, and a second electrode provided above, and spaced by an insulating layer from, the first electrode, wherein the memory element has, at a side face of the first electrode, a region L a resistance value of which can be changed from a high-resistance state into a low-resistance state, between the first electrode and the second electrode.

BRIEF DESCRIPTION OF THE DRAWINGS

FIGS. 1, 3, 11, and 14 are diagrammatic sectional views, each for explaining a preferred example of the memory apparatus of the present invention;

FIG. 4A to FIG. 7B are drawings for explaining an example of fabrication procedures for a preferred example of the memory apparatus of the present invention, FIGS. 4A, 5A, 6A and 7A being diagrammatic sectional views and FIGS. 4B, 5B, 6B and 7B being diagrammatic plan views;

DESCRIPTION OF THE PREFERRED EMBODIMENTS

Figure 1:
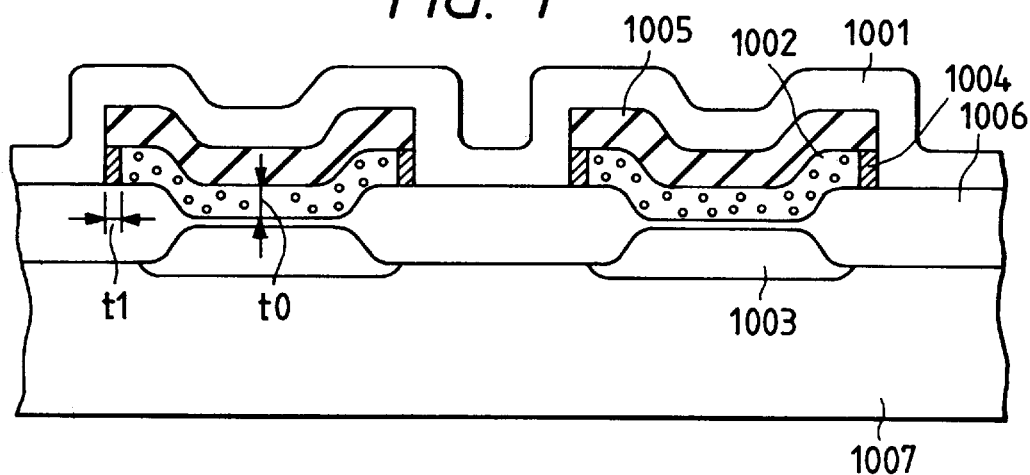

Briefly describing a preferred form of the memory apparatus of the present invention, the apparatus is constructed in such an arrangement that there are a well of MOSFET, a floating gate provided through an insulating layer above a region for separating a source and a drain provided in contact with the well, and a control gate provided on an insulating layer above the floating gate, that a resistance value of the insulating layer is arranged as capable of being changed, and that the floating gate and the control gate are electrically connected by a change of the resistance, that is, by a change of from high resistance to low resistance, thereby effecting writing.

The above objects can be achieved by the apparatus as described below accordingly.

A memory apparatus of the present invention has a memory element which comprises, on a substrate, a first semiconductor region of one conduction type, second and third semiconductor regions of a conduction type opposite to the one conduction type in contact with the first semiconductor region, a first electrode provided on an insulating layer above a region for separating the second semiconductor region and the third semiconductor region, and a second electrode provided through an insulating layer above the first electrode, wherein the memory element has a region a resistance value of which can be changed from a high-resistance state into a low-resistance state, between the first electrode and the second electrode and wherein a value of a main capacitance formed between the first electrode and the second electrode is arranged to be dependent upon a thickness of the first electrode.

Further, the memory apparatus of the present invention has a memory element which comprises, on a substrate, a first semiconductor region of one conduction type, second and third semiconductor regions of a conduction type opposite to the one conduction type in contact with the first semiconductor region, a first electrode provided on an insulating layer above a region for separating the second semiconductor region and the third semiconductor region, a region provided at a side face of the first electrode, a resistance value of which between the first electrode and a second electrode can be changed from a high-resistance state into a low-resistance state, and a second electrode provided on the region.

Further, the memory apparatus of the present invention can change the resistance value in the above memory element by a voltage applied to the second electrode.

Further, the memory apparatus of the present invention is desired to have a plurality of memory elements as described above, and to be arranged in such a manner that in the plurality of memory elements the second or third semiconductor region of the i-th memory element is electrically connected with the third or second semiconductor region of the (i+1)-th memory element.

Moreover, the substrate of the memory apparatus of the present invention may be a substrate having a Si layer on an insulating layer.

Moreover, the memory apparatus of the present invention is desired to be arranged in such a structure that the memory elements are arranged in a matrix, lines are provided so that each line connects second electrodes in common along one direction of arrangement, first semiconductor regions of the above memory elements arrayed in a direction perpendicular to the lines are connected in common, and the first semiconductor regions in each array are electrically separated.

Additionally, the memory apparatus of the present invention is preferably arranged in such a manner that a capacitance formed between the first electrode and the semiconductor region having the first, second, and third semiconductor regions is set greater than a capacitance formed between the second electrode and the first electrode.

Further, in the memory apparatus of the present invention, the capacitance formed between the first electrode and the second electrode can be set small as being kept free of the restrictions of photolithography.

Moreover, in the memory apparatus of the present invention, the first electrode is preferably of a material containing polycrystal Si.

Moreover, it is preferred in the memory apparatus of the present invention that the insulating layer between the semiconductor region comprising the first, second, and third semiconductor regions and the first electrode be formed of a film having Si and N or O or that the insulating layer be of a film having Si, N, and O.

Moreover, the memory apparatus of the present invention may have a memory element of a different structure from the memory element of the present invention, in a part of the memory apparatus.

Moreover, it is desired in the memory apparatus of the present invention that a peripheral circuit thereof be constructed of a CMOS circuit.

Moreover, the memory apparatus of the present invention may be arranged in such a manner that the first electrodes and the second electrodes are arranged in a matrix and the apparatus further comprises regions, each changing a resistance value thereof from a high-resistance state into a low-resistance state between the first electrode and the second electrode at an intersecting portion in the matrix.

Moreover, the memory apparatus of the present invention may have a plurality of memory elements as described above, which are arranged in such a manner that in memory elements for information to be written therein the first semiconductor regions are connected to a desired power supply and in memory elements for information not to be written therein the first semiconductor regions are kept in a floating state.

Moreover, the memory apparatus of the present invention is desired to be arranged in such a manner that the insulating layer the resistance value of which between the first electrode and the second electrode can be changed from the high-resistance state into the low-resistance state is formed at an end and side portion of the first electrode.

Moreover, the memory apparatus of the present invention is desired to be arranged in such a manner that the insulating layer the resistance value of which between the first electrode and the second electrode can be changed from the high-resistance state into the low-resistance state is formed at a side face of an aperture portion in the first electrode with an aperture.

Moreover, in the memory apparatus of the present invention, a first voltage $V_1$ applied to the second electrode when information is written in the memory element is set greater than a second voltage $V_2$ applied to the second electrode when information is read out from the memory element.

Moreover, the memory apparatus of the present invention may be arranged in such a manner that writing data is written in the memory element and a memory element of a structure other than that, the writing data is read out from the both memory elements, and results read out from the two memory elements can be collated with each other.

Moreover, the memory apparatus of the present invention may be provided with a circuit having a plurality of gate electrodes through a floating gate in at least a part of the peripheral circuit.

Moreover, the memory apparatus of the present invention is desired to satisfy the following relations:

$$\{C_{FG}/(C_{FG}+C_{CG})\} \cdot V_1 \geq V_{BD}$$

$$\{C_{CG}/(C_{FG}+C_{CG})\} \cdot V_2 < V_{th}$$

$$V_2 > V_{th}$$

where $V_{BD}$ is a voltage between the first electrode and the second electrode when the resistance value between the first electrode and the second electrode changes from the high-resistance state into the low-resistance state, $V_{th}$ is a threshold value of an insulating gate type transistor formed when the second and third semiconductor regions are main electrode regions, the first semiconductor region is a control electrode region, and the first electrode is a control electrode, $C_{FG}$ is a capacitance formed between the first electrode and the first, second, and third semiconductor regions, $C_{CG}$ is a capacitance formed between the first electrode and the second electrode, and $V_1$ and $V_2$ are voltages applied to the second electrode upon writing and upon reading, respectively.

Additionally, the memory apparatus of the present invention may be arranged in such a manner that the above memory apparatus further comprises a region for writing the collation result.

The present invention will be explained in detail as referring to the drawings with necessity.

Figure 2:
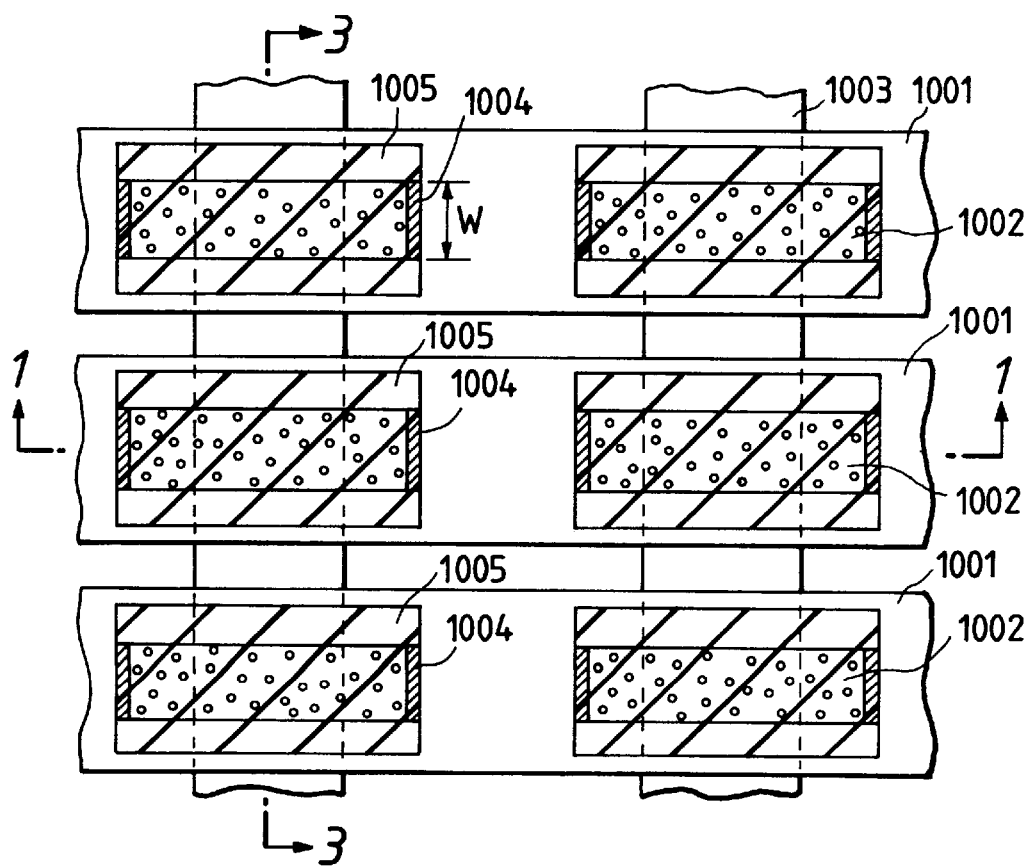
FIGS. 2 and 13 are diagrammatic plan views, each for explaining a preferred example of the memory apparatus of the present invention.

FIG. 1 and FIG. 3 are drawings for explaining a preferred memory apparatus of the present invention, showing diagrammatic, sectional, structural drawings of a memory element portion (memory cell portion) of the apparatus. FIG. 2 is a diagrammatic plan view of the memory cell portion, and FIG. 1 is a cross-section along 1—1 in FIG. 2. FIG. 3 is a cross-section along 3—3 in FIG. 2. In FIG. 1 to FIG. 3, reference numeral 1001 designates control gates (to become second electrodes), 1002 floating gates (to become first electrodes), 1003 a well layer of MOSFET (to become first semiconductor regions), 1004 thin high-resistance layer regions (high-resistance regions), 1005 an insulating layer, 1006 an insulating layer, and 1007 a substrate. In FIG. 3 numeral 1008 denotes a source or drain layer of MOSFET (to become second and third semiconductor regions). Although this example is constructed so that the control gate may cover the floating gate, this structure is not always essential, and the control gate may be formed only above the high-resistance layer 1004 provided at the end and side face of the floating gate (which is the case in each example as detailed below).

In FIG. 2 the insulating layer 1006 is omitted in order to avoid complexity of illustration, and the well layer 1003 is schematically shown therein. As for discrimination between solid lines and dashed lines, the figure is illustrated as giving priority to easiness to see in order to avoid complexity. It is thus noted that the portions represented by the solid lines in FIG. 2 are not always exposed in the outermost surface. Since positional relations between the layers and between the portions can be understood from FIG. 1 and FIG. 3, reference should be made to them in order to understand the relations.

Now, explanation is given of the conditions to be satisfied by a memory cell capable of changing the region between the control gate and the floating gate from a high-resistance state into a low-resistance state, according to the present invention.

The memory cell capable of changing the region between the control gate and the floating gate from the high-resistance state into the low-resistance state is desired to satisfy the conditions that $V_{BD}$ is low and $C_{CG}$ is small, from the principle of operation thereof (as described below) (where $V_{BD}$ is a voltage between the floating gate and the control gate when the resistance value between the control gate and the floating gate changes from the high-resistance state into the low-resistance state and $C_{CG}$ is a capacitance between the floating gate and the control gate).

In order to make $V_{BD}$ lower, the separation (T) between the control gate and the floating gate is desired to be made smaller so as to increase the intensity of the electric field between the control gate and the floating gate. Then, in order to make $C_{CG}$ smaller as keeping the separation (T) small, the area should be decreased of the region of the smallest separation (T) when the control gate is closest to the floating gate.

The memory apparatus shown in FIG. 1 to FIG. 3 has the structure suitable to satisfying the above conditions, wherein the thin high-resistance layer 1004 is formed in the end and side portions of the floating gate 1002 and the control gate 1001 is further formed, thus forming the major capacitance $C_{CG}$. This structure allows the high-resistance layer to be formed as thin as possible and as small in the area as possible, thus satisfying the conditions that $V_{BD}$ is low and $C_{CG}$ is small.

In this example, the capacitance $C_{CG}$ between the floating gate 1002 and the control gate 1001 is mainly determined by the thickness t1 (shown in FIG. 1) and the area s1 of the high-resistance layer region 1004. The area s1 of the high-resistance layer region 1004 is determined by the product between the line width W (shown in FIG. 2) of the floating gate 1002 and the film thickness t0 (shown in FIG. 1) thereof. The line width W is limited by the technology of photolithography (to a width of at least 0.3 μm at present), but the film thickness t0 of the floating gate, for example if the floating gate is formed by depositing polySi by the LPCVD process, can be a thickness of 0.01 μm (100 angstroms), which is a width that cannot be formed by the present photolithography technology, and variations thereof can adequately be controlled within 1%. The floating gate may be made of a high-melting-point silicide such as tungsten silicide. The film thickness t1 is preferably selected in the range of 10 Å to 300 Å, further preferably in the range of 30 Å to 200 Å, and more preferably in the range of 50 Å to 150 Å. This thickness is properly selected depending upon the voltage applied for changing the region into the low-resistance state. The thickness should be not less than 50 Å from the viewpoint of maintaining sure electric insulation and not more than 150 Å in order to lower the voltage applied, which are the reasons for the more preferred range of thickness.

As explained, the film thickness t0 of the floating gate 1002, which is a factor for determining the area s1 of the high-resistance layer region 1004, is independent of the limitations of photolithography, so that it can be determined to be small with extremely good accuracy and, therefore, the area s1 of the high-resistance layer region 1004 can also be determined to be small with extremely good accuracy. Since the film thickness t1 of the high-resistance layer region 1004 can be set by the deposition conditions of film, it is free of the limitations of photolithography.

The capacitance $C_{CG}$ mainly determined by the film thickness t1 and the area s1 of the high-resistance layer region 1004 can be determined to be small with extremely good accuracy accordingly.

On the other hand, the voltage $V_{BD}$ between the floating gate 1002 and the control gate 1001 when the resistance value between the control gate 1001 and the floating gate 1002 changes from the high-resistance state into the low-resistance state is mainly determined by the film thickness t1 of the thin high-resistance layer region 1004. Thus, the voltage can be decreased by making the high-resistance layer region 1004 thinner. The high-resistance layer region 1004 of the present invention is a region where the resistance changes with application of a voltage, and this layer region does not have to remain as a layer after changed into the low-resistance state. The essential point is that electric conduction is achieved between the electrodes.

A preferred example of a method for forming the above memory apparatus is next described referring to FIG. 4A to FIG. 7B. In these drawings, FIGS. 4B, 5B, 6B and 7B are diagrammatic plan views of the memory cell portion and FIGS. 4A, 5A, 6A and 7A of each drawing are diagrammatic sectional view when along lines 4A—4A, 5A—5A, 6A—6A and 7A—7A in FIGS. 4B, 5B, 6B and 7B.

First, the p-type Si substrate 1007 was prepared. The p-type Si substrate 1007 may be one containing impurities in the impurity concentration level of $10^{14}$ to $10^{17}$ cm$^{-3}$, and a desired substrate is of the level of $10^{16}$ cm$^{-3}$ from the points of the width between wells to be separated and the capacitance formed in the well. Then, as shown in FIG. 4A and FIG. 4B, the field oxide film 1006 for separation of elements was formed by the process of local oxidation of silicon or modified local oxidation of silicon (in which after grooves are formed by etching Si where the field oxide film is to be formed, silicon is oxidized, whereby bird's peaks become narrow, thus narrowing the separation width). After that, patterning was conducted for forming n wells 1003, and then ion implantation was carried out to form the wells 1003 containing impurities in the impurity concentration about 2 to 7 times greater than that of the substrate. In this case, the depth of the wells was determined to be at the same level as the bottom of the field oxide film 1006 in order to ensure a withstand voltage between n well and n well, and the wells were thus considerably shallower than the ordinary wells. After that, a thermal oxide film was formed in 85 angstroms by wet oxidation at 750° C. to 1100° C. and then was subjected to a thermal treatment including a treatment in an NH$_3$ atmosphere at 950° C. to 1100° C. for 90 seconds and a treatment in an O$_2$ atmosphere or N$_2$O atmosphere at 1150° C. for 90 seconds, thereby forming an SiON film (a film containing silicon atoms, oxygen atoms, and nitrogen atoms) having the effective thickness of about 100 angstroms. After that, the first layer of polySi denoted by 1002 was formed in 4000 angstroms by the LPCVD (Low Pressure Chemical Vapor Deposition) process. This first polySi layer may be modified to form a silicide or polysilicide by putting a high-melting-point metal such as W, Ti, Ta, or Mo on the layer and thereafter annealing it, or the high-melting-point metal selected therefrom may directly be used instead of the first polySi. Use of these low-resistance materials can decrease the film thickness of the floating gate, so that the capacitance of $C_{FG}$ can also be decreased in addition to achieving flatness thereof. The silicide (or polysilicide) and high-melting-point metal can form an insulating layer, for example, by oxidation or nitration. Particularly, use of Ta is more preferred, because it turns into Ta$_2$O$_5$ by oxidation and it has a property of high electric insulation but turns into low resistance when destroyed.

Next, ion implantation and annealing was carried out to dope the above polySi with impurities, and gate electrodes were formed by patterning of the first polySi layer. On this occasion, patterns of polysi are formed each in a shape connected in the direction of lines 4A—4A, 5A—5A. 6A—6A and 7A—7A in the drawing. Next, using this polysi, the source and drain regions of a PMOSFET were formed in a self-aligning manner by the ion implantation process (not shown). It is preferred to employ the LDD structure or the GOLD structure in order to relieve the electric field at the source and drain edges in the cases of scale down.

Next, as shown in FIG. 5A and FIG. 5B, the polySi layer 1002 was subjected to wet oxidation at 950° C. to form the $SiO_2$ layer 1005 in 2000 angstroms.

Figure 7A:
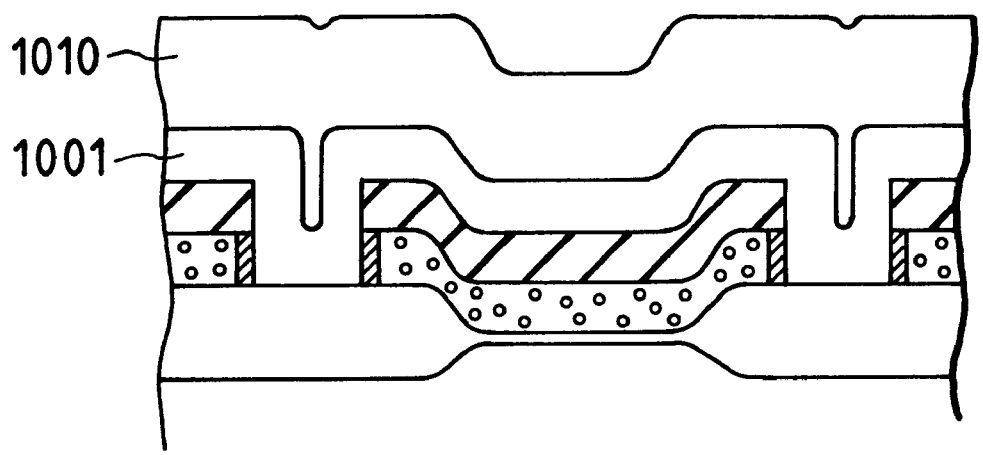
Figure 7B:
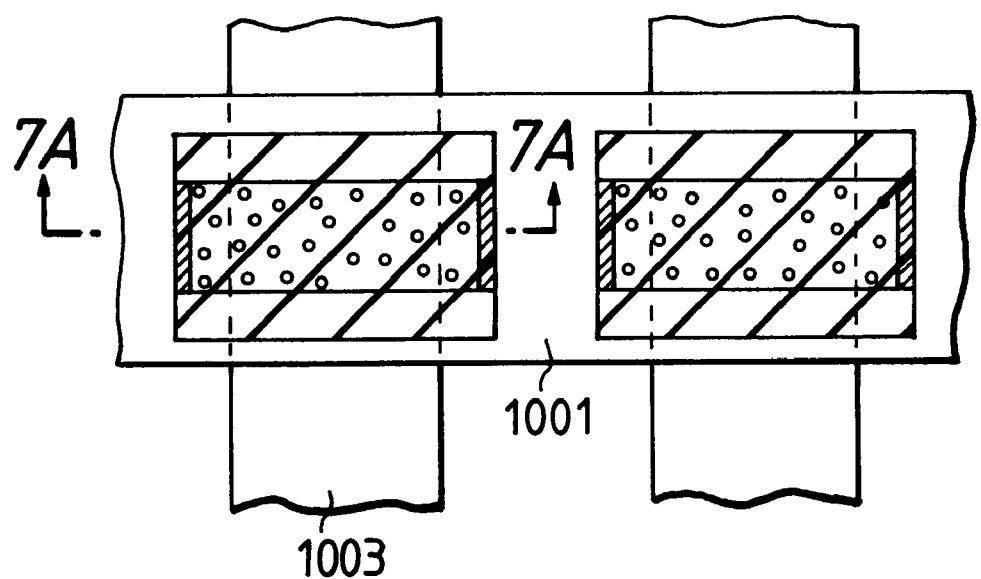

Then a resist layer 1009 was patterned and with a mask of this layer the $SiO_2$ layer 1005 and polysi layer 1002 were anisotropically etched in succession, and thereafter the resist was removed. Next, as shown in FIG. 6A and FIG. 6B, the very thin high-resistance layer region 1004 was formed in the cross-section formed by the above etching. In this case, the high-resistance layer region may be one subjected to dry oxidation at the temperature for example of 800° C., or may be one obtained by forming a chemically oxidized film of about 10 angstroms to 50 angstroms in a pure water including an additive of ozone ($O_3$), in an acid ($H_2SO_4$, HCl) including an additive of hydrogen peroxide, or in an alkali ($NH_4OH$) and thereafter thermally treating it in an inert gas atmosphere such as high-purity Ar or $N_2$ at 500° C. to 600° C. for 30 minutes. After that, as shown in FIG. 7A and FIG. 7B, the second layer of polySi was formed on the wafer again by the LP-CVD process, and word lines 1001, becoming the control gates, were formed by doping with impurity and patterning in the same manner as in the previous process. If the word lines are long, it is preferred to use a metal polysilicide (or metal silicide) containing a metal, for example W-polysilicide (tungsten polysilicide) or the like, in order to decrease the resistance. The high-resistance layer region may be made of a material selected from inorganic oxides well known, for example preferably selected from materials containing silicon and oxygen or nitrogen, materials containing silicon, oxygen, and nitrogen, and $Ta_2O_5$.

When the high-resistance layer region 1004 was formed in this manner between the control gate 1001 and the floating gate 1002, $C_{CG}$ was formed with very good accuracy and repeatability, as explained previously. It is, however, noted herein that the $SiO_2$ layer 1005 is formed by oxidizing the polysi layer 1002 and, therefore, it becomes thinner than the thickness of the initial polysi layer.

Thereafter were formed in the same manner as in the ordinary LSI process an interlayer insulation layer 1010, for example of BPSG or the like, contacts (not shown), metal wiring (not shown), and a passivation film, and then pad portions (not shown) were patterned, thus concluding the process. The number of masks used for forming the above structure is not more than a half of that necessary for fabricating normal memories, including DRAM, SRAM, and flash $E^2PROM$. The memory elements thus formed each have a small area per bit and can be formed by the very simple steps and at high yield, thus reducing the cost.

The description of the fabrication process of the present structure concerned the single-side well structure, but, without having to be limited to it, it is of course effective to employ the double well structure of n-type well and p-type well, formation of a channel stop layer in separating portions, and trench separation in some cases.

Figure 8:
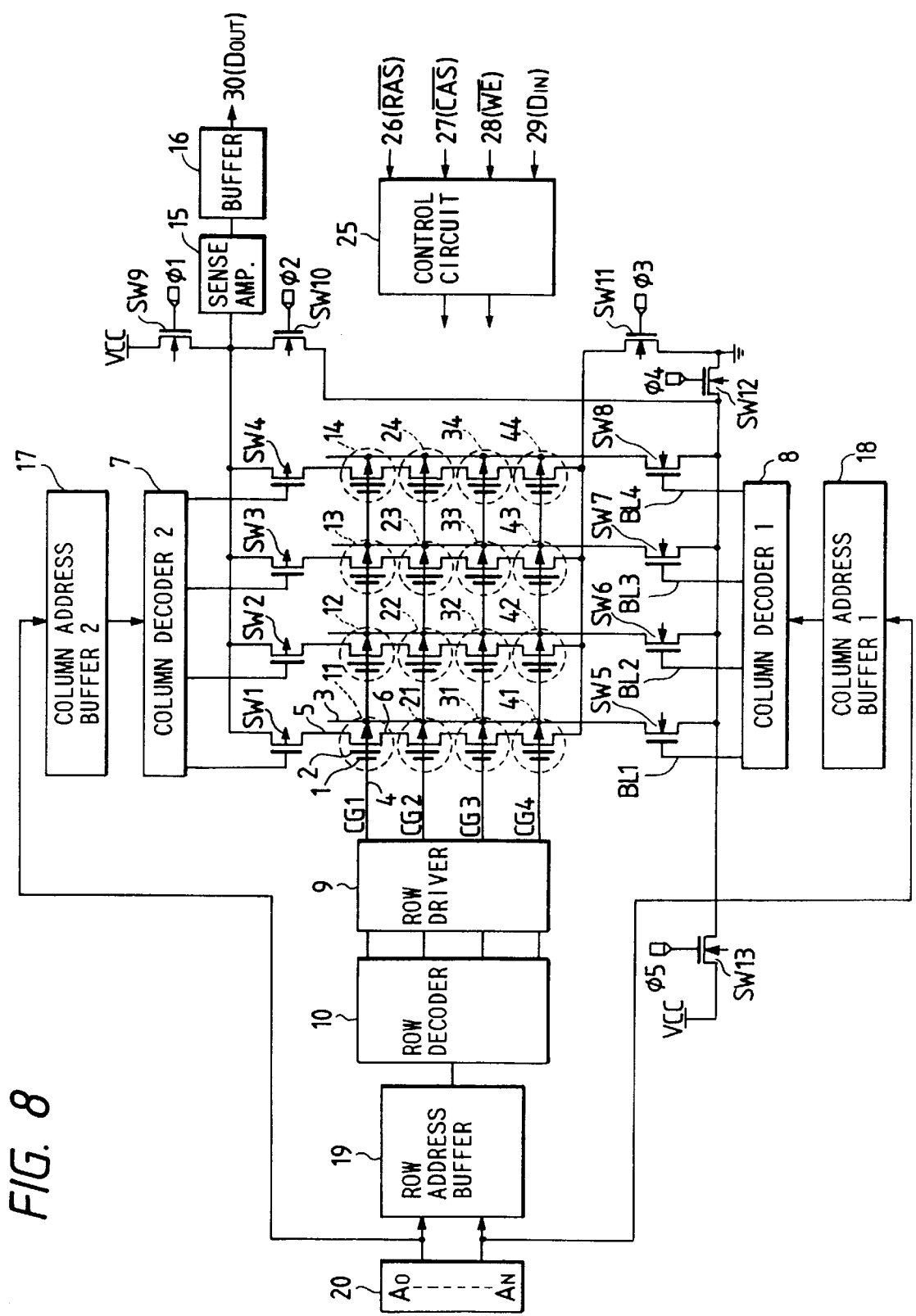
FIG. 8 and FIG. 15 are schematic equivalent circuit diagrams, each showing a preferred memory apparatus of the present invention.

FIG. 8 shows an example of an equivalent circuit of a fundamental block of the memory apparatus according to the present invention. In FIG. 8, numerals 11, 12, 13, 14, 21, 22, 23, 24, 31, 32, 33, 34, 41, 42, 43, 44 each denote memory cells, and here is shown a case of the 4×4 cell structure for convenience' sake in explanation.

In a memory cell, numeral 1 designates the control gate (to become the second electrode), 2 the floating gate (to become the first electrode), 3 the well layer of a MOSFET (to become the first semiconductor region), 4 the word line to which each control gate is connected, and 5, 6 the source and drain portions, respectively, of the MOSFET (to become the second and third semiconductor regions). The sources and drains of the cells are connected in series with each other in each column. Numeral 7 represents a column decoder for selecting a read-out column, 8 a column decoder for selecting a writing bit line, 9 a row driver for driving the word lines, 10 a row decoder for selecting the word lines, 15 a sense amplifier, and 16 a buffer amplifier. Further, numerals 17 and 18 denote column address buffers, which transmit an address input from 20 to the column decoders of 7 and 8. SW1 to SW13 are switches of MOSFETs, and the switches SW9, SW10, SW11, SW12, SW13 are controlled by pulses φ1, φ2, φ3, φ4, φ5. Numeral 26 stands for a row address strobe ($\overline{RAS}$), 27 for a column address strobe ($\overline{CAS}$), 28 for a write enable ($\overline{WE}$), 29 for a signal of input data ($D_{IN}$), and 30 for a signal of output data ($D_{OUT}$).

The operation of this memory apparatus is next explained. This apparatus is arranged to input two types of address signals through a same input pin in time division. After a column address becomes definite, the column address is taken into the chip by inputting $\overline{CAS}$ denoted by 27 from the high level to the low level. Then, after a row address becomes definite, the row address is taken into the chip by inputting $\overline{RAS}$ denoted by 26 from the high level to the low level. This arrangement can reduce the number of pins for address by half. Whether the chip is in a reading state or in a writing state is determined by whether the $\overline{WE}$ signal denoted by 28 is in the high level or in the low level.

In the reading case effective output data is obtained from the $D_{OUT}$ terminal denoted by 30 a certain time after $\overline{RAS}$. In the writing case data is written through the $D_{IN}$ terminal denoted by 29.

Figure 9:
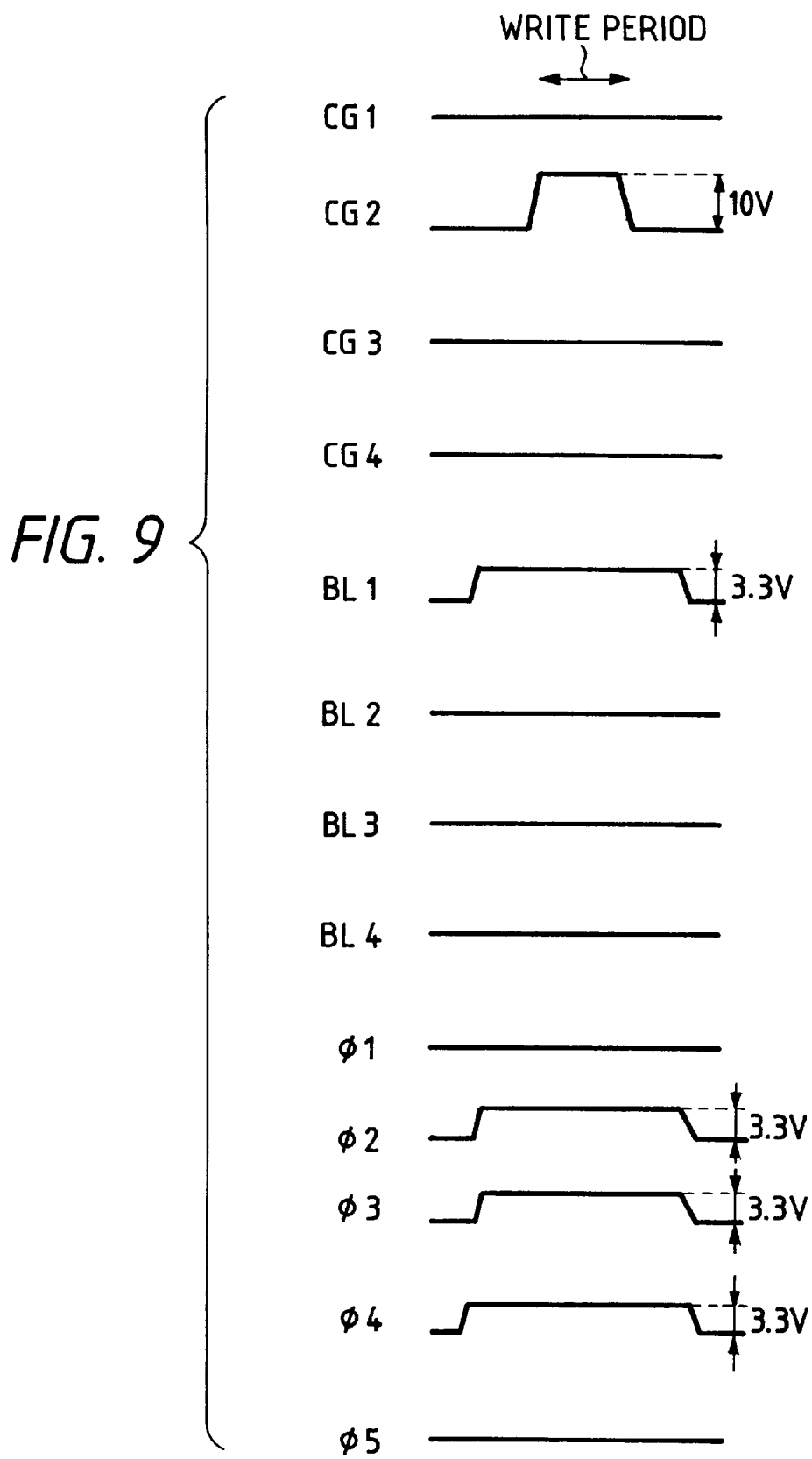
FIG. 9 and FIG. 10 are timing charts, each for explaining an example of operation of the memory apparatus of the present invention.

An example of the writing operation is next explained in detail referring to the schematic timing chart shown in FIG. 9. The power-supply voltage of this chip was set to 3.3 V, thereby reducing the dissipation power. Further, CG1, CG2, CG3 and CG4 in FIG. 9 represent the potentials of the first, the second, the third, and the fourth word lines in FIG. 8. BL1, BL2, BL3 and BL4 are pulses each input into SW5 to SW8 of nMOSFETs. FIG. 9 shows an example of pulses when writing is made in cell 21 in the present memory apparatus. Before writing, the pulses BL1, BL2, BL3 and BL4 from the column decoder 1 denoted by 8 are in the high level, in the low level, in the low level, and in the low level, respectively, whereby the switch SW5 is on and the other switches SW6, SW7 and SW8 are off. This makes the well of the first column having the writing cell fixed at GND and the well potentials of the other second to fourth columns in a floating state.

Further, SW9, SW10, SW11, SW12 and SW13 are also comprised of n-type MOSFETs, and the pulses φ1, φ2, φ3, φ4 and φ5 are set to the low level, the high level, the high level, the high level, and the low level, respectively, as shown in FIG. 9. In addition, SW1 to SW4 are comprised of p-type MOSFETs and pulses from the column decoder 2 denoted by 7 all are set to the low level, whereby the source and drain electrodes of each cell are fixed at the GND potential.

The row driver denoted by 9 next applied a pulse with an amplitude of 10 V only to the word line connected to the writing cell 21. In this case, the power-supply voltage is 3.3 V, but because no current flows, a high voltage can readily be made in the chip by a booster circuit. With application of the writing pulse a bias of about 6.6 V is applied between the control gate 1 and the floating gate 2 of cell 21, so that the region between the control gate 1 and the floating gate 2 changes from the high-resistance state into the low-resistance state in some 10 ns, thus completing writing. Since with application of the above pulse a bias of only about 0.1 to 0.5 V is applied between the control gate and the floating gate of the cells 22, 23 and 24 connected to the same word line, the regions are kept in the high-resistance state between the control gate and the floating gate without writing. The reason is that SW6 to SW8 are off to keep the well potentials of the second column, the third column, and the fourth column in the floating state and the voltage applied is applied to the well and the substrate without being applied between the control gate and the floating gate. After completion of writing, the word line potential is returned to 0 V as shown in CG2 of FIG. 9.

As explained above, the memory apparatus of the present invention is utterly novel in that the gate structure of a transistor formed in each cell is the lamination structure of the floating gate and the control gate and in that writing is made by changing the resistance value (or decreasing the resistance) between the floating gate and the control gate with the pulse applied to the control gate.

Figure 10:
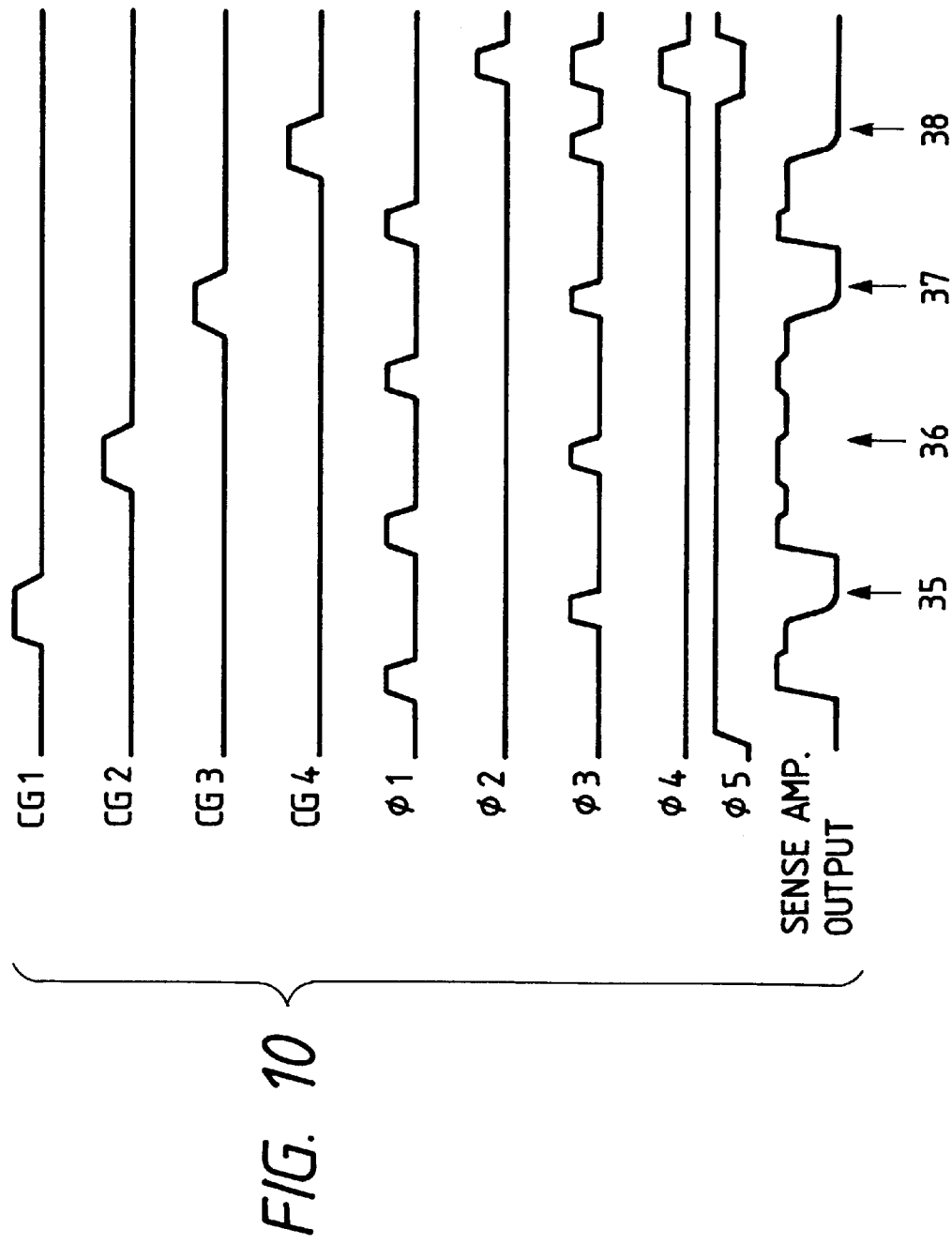

An example of the reading operation of the present invention is next explained using the schematic timing chart shown in FIG. 10. The transistor forming each cell is a p-type MOSFET, and a threshold value thereof is set to −1.8 V. Although this example showed the cell portions of p-type MOSFETs, it is a matter of course that the present invention can be applied to the cases using n-type MOSFETs.

Let us suppose that a reading column is the first column in FIG. 8, that writing was done only in cell 21 in the column, and that no writing was done in the other cells 11, 31 and 41.

To read the information in the first column, the column decoder 2 denoted by 7 applies such pulses as to make only the transistor of SW1 on and to keep the other transistors of SW2, SW3 and SW4 off to the gates of the respective switches. In the reading operation, when the cell transistors are of PMOSs, SW12 is off, SW13 is on, and SW5 is on so as to fix at least the well potential of the reading column at the maximum potential. When the cell transistors are of NMOSs, the well potential fixed is the minimum potential, of course.

First, pulse φ1 is turned to the high level, thereby precharging the sources and drains of cells 11, 21, 31 and 41 to $V_{cc}$ level. This is achieved when the all word lines 4 are at 0 V and the PMOSFET of each cell is on. Next, the pulse φ1 is changed to the low level, whereby the pulse CG1 with the amplitude of 3.3 V is applied to the word line connected to the cell 11 in order to read the cell 11, as shown in FIG. 10. Since the cell 11 is a cell without written information, the floating gate potential is 1.1 V determined by capacitance division of the control and floating gate capacitance. The threshold value of this p-type MOSFET is −1.8 V as described above, and the PMOSFET of cell 11 is kept on even with application of the above pulse. Accordingly, since with application of pulse φ3 the p-type MOSFETs in the first column all are on, the output of the sense amplifier 15 is lowered as shown by 35 in FIG. 10, which teaches that the cell 11 includes no written information. Next, after again applying the pulse φ1 to effect precharge, the pulse CG2 was changed to the high level in order to read the cell 21. Since the amplitude is 3.3 V and this cell 21 includes written information, the control gate and the floating gate are connected in the low-resistance state, and the voltage of 3.3 V is applied as it is. Therefore, the p-type MOSFET of cell 21 becomes off. The output of the sense amplifier is thus kept at the high level with application of the pulse φ3, as shown by 36 in FIG. 10, which teaches that information is written in the cell. Repeating the above operation, it is found out that the outputs of cells 31 and 41 are at the low level as shown by 37 and 38 in FIG. 10, clarifying no written information therein.

After completion of reading, the pulses φ2, φ3 and φ4 were set to the high level and the pulses φ1 and φ5 to the low level, whereby not only the control gates of cells, but also the source, the drain, and the well were set to 0 V. This made the floating gate potentials stably at 0 V of the initial state, thus preventing occurrence of malfunction. Namely, at standby, the source, drain, control gate, and well all are at 0 V, and even with a little flow of leak current to the floating gates they are always automatically reset to 0 V, thereby keeping the operation stable.

More stable writing can be done by satisfying the following relations:

$$\{C_{FG}/(C_{FG}+C_{CG}))\} \cdot V_1 \geq V_{BD}$$

$$\{C_{CG}/(C_{FG}+C_{CG}))\} \cdot V_2 < V_{th}$$

$$V_2 > V_{th}$$

where $V_{BD}$ is the voltage between the floating gate 2 and the control gate 1 when the resistance value between the floating gate 2 and the control gate 1 changes from the high-resistance state into the low-resistance state, $V_{th}$ is the threshold value of MOSFET, $C_{FG}$ is the capacitance formed between the floating gate 2 and the source region, the drain region, and the well region of MOSFET, $C_{CG}$ is the capacitance formed between the floating gate 2 and the control gate 1, and $V_1$ and $V_2$ are the voltages applied to the control gate upon writing and upon reading, respectively.

As is apparent from the relations of the above equations, there are the following three methods for decreasing the writing voltage $V_1$:

(1) To decrease $V_{BD}$. This can be achieved by decreasing the separation (T) of the proximate portion between the control gate and the floating gate.

(2) To decrease $C_{CG}$. This can be achieved by decreasing the area of the proximate portion between the control gate and the floating gate. To increase the thickness of the proximate portion between the control gate and the floating gate increases $V_{BD}$, which is thus not preferred in order to decrease the voltage $V_1$.

(3) To increase $C_{FG}$. This can conceivably be achieved by decreasing the thickness or increasing the area between the floating gate and the source region, the drain region, and the well region of MOSFET. This, however, causes such influence as to change performance characteristics of element, to decrease the operation speed, and to increase the element area.

In view of the operation of element and the degree of integration, to decrease $V_{BD}$ and $C_{CG}$ in combination of (1) with (2) is suitable for decreasing the writing voltage $V_1$.

From the equations described above, it is understood that the relation of $C_{CG} < C_{FG}$ is desired to be satisfied in order to decrease the writing voltage $V_1$.

As explained above, the memory (memory apparatus). as described above has the following excellent points:

(i) The memory structure is simple, and the area of a cell portion is determined only by the word line and the patterning accuracy of Si active layer. Thus, the area of one cell without contact can be made equal to or smaller than those of the conventional memories, whereby the bit cost can be reduced.

(ii) The number of masks necessary for forming this structure is about half of that necessary for DRAM, SRAM, flash memory, etc., which permits a further cost reduction. Since the steps are easy, the problems of dust, pattern defects, etc., rarely occur, which increases the yield.

(iii) The writing method is based on breakdown of the insulator layer between the first and second polySi layers. The withstand voltage of the polySi oxide film is lower than that of the C-Si oxide film, and the withstand voltage can be controlled very well and stably to a desired value by combination with new process techniques such as the chemical oxidation process, the oxygen doping process, etc., which keeps an error rarely occurring upon writing.

(iv) In addition, the partially written information is permanent. This obviates needs to connect a power supply to the memory and to perform complex operation, including refresh.

(v) The time necessary for writing is some 10 ns or less, and thus the writing speed is very high, which enables very good matching with the system.

(vi) Since the reading and writing states are not so dependent on the environmental conditions (though the flash memory, DRAM, etc., are strongly dependent on the leak current), applications can include wide variations.

Figure 11:
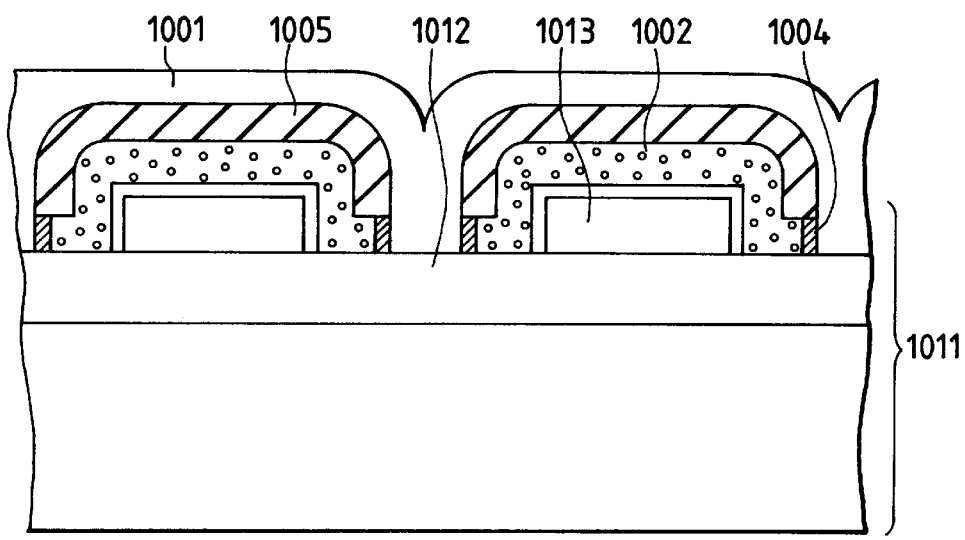

Another preferred example of the memory apparatus of the present invention is next explained referring to FIG. 11. The above-described example used the Si wafer as a substrate, whereas this example uses an SOI substrate. FIG. 11 shows a diagrammatic sectional structure (corresponding to FIG. 1) of the memory cell portion. The same portions will be denoted by the same reference numerals as those in FIG. 1 to FIG. 7B used in the description of the above-described example, and explanation of the same portions will be omitted. Numeral 1011 designates the SOI substrate, which may be any SOI wafer of good quality, for example selected from SIMOX, cemented SOI wafer, SOI wafer fabricated by forming a porous layer on a surface of Si, forming an epitaxial layer on the porous surface, cementing the wafer with the epitaxial film formed on the porous surface to a wafer having an insulating layer surface, and removing the porous layer, etc. The conduction type of the substrate may be either the n-type or the p-type, and the essential point is to control the bias of the substrate so as not to turn a parasitic MOS transistor (which is a MOS transistor occurring when the oxide film of 1012 is regarded as a gate insulating layer) formed through the oxide layer 1012 of SOI on. Channel portions of cell portions each are separated in island patterns, as shown by 1013, and the floating gates 1002 cover the channel portions.

This increases the capacitance $C_{FG}$ formed between the channel portion 1013 and the floating gate 1002, which can decrease the voltage $V_1$. Namely, in this example the insulating layer between the channel portion 1013 and the floating gate 1002 is also formed at the end and side faces of the channel portion 1013, as shown in FIG. 11. Therefore, the capacitance $C_{FG}$ becomes greater than that in the example shown in FIG. 1, which results in increasing the fraction $C_{FG}/(C_{FG}+C_{CG})$ in the above equation. This can decrease the voltage $V_1$ applied to the control gate upon writing. Since the effective channel regions can be formed larger, the performance of MOS transistor can be enhanced. The regions between channels are perfectly insulated and separated, which can stabilize the operation.

Since in the structure of this example the layer below the channel portions (corresponding to the wells in the previous example) is the insulating layer, the capacitance of the channel portion is smaller than those in the case of using a bulk substrate. This decreases the voltage between the control gate and the floating gate in non-writing bits upon writing, which rarely causes a writing error and which increases margins of the structure process.

Figure 12A:
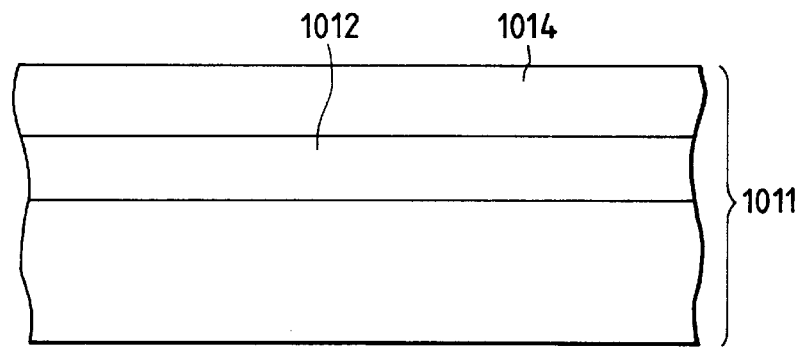
FIGS. 12A and 12B are diagrammatic sectional views for explaining an example of fabrication procedures for a preferred example of the memory apparatus in the present invention.
Figure 12B:
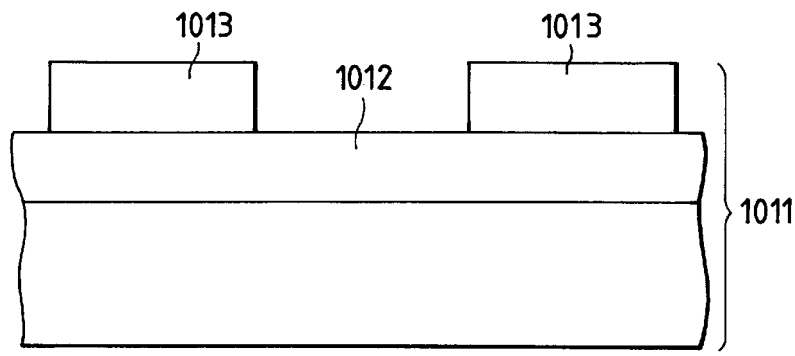

A difference of the fabrication process of this example from the previous example is next briefly described referring to FIG. 12A and FIG. 12B. A different point of the process for forming the memory apparatus of this example from the previous example is only that the channel portions 1013 are separated by patterning. The other parts can be formed in the same manner as in the steps shown in FIG. 4A to FIG. 7B in the previous example.

In more detail, this example includes patterning by the ordinary photoetching process of a Si layer 1014 of the SOI wafer shown in the diagrammatic sectional view of FIG. 12A, thereby obtaining the shape in which the Si layer to become the channel portions 1013 is left in island patterns as shown in the diagrammatic sectional view of FIG. 12B. After that, the structure shown in FIG. 11 can be obtained through the same steps in FIG. 4A to FIG. 7B.

Figure 13:
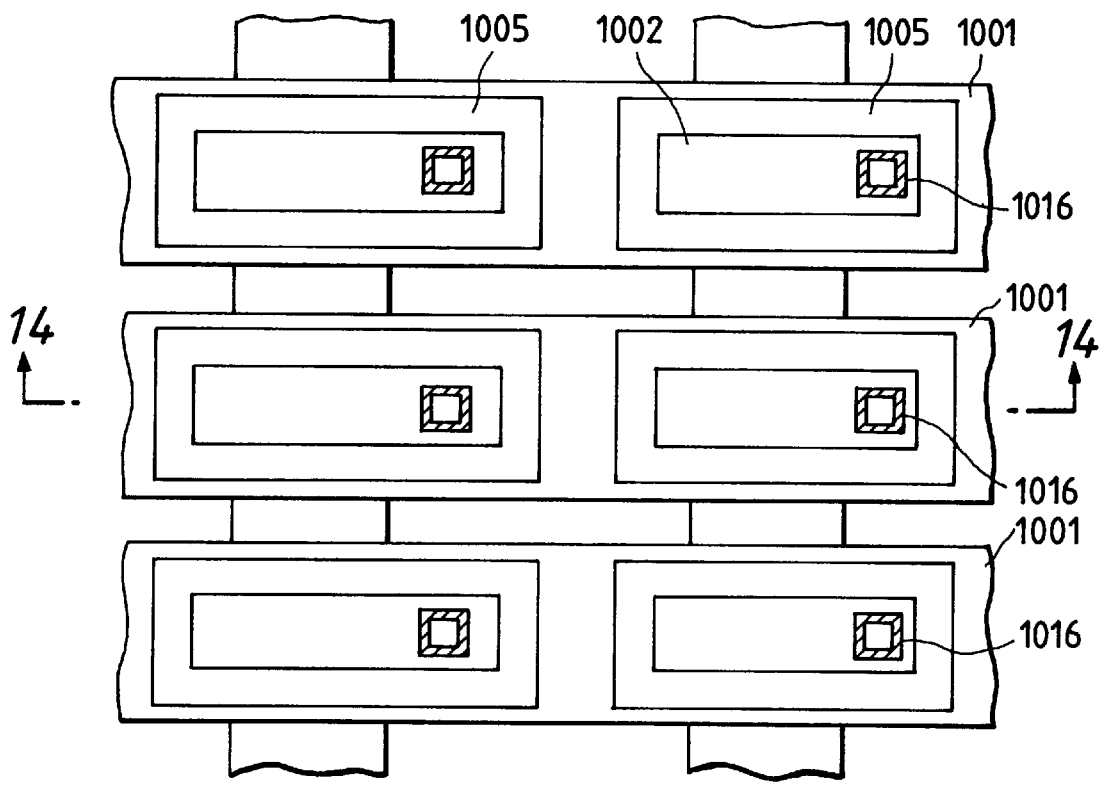
Figure 14:
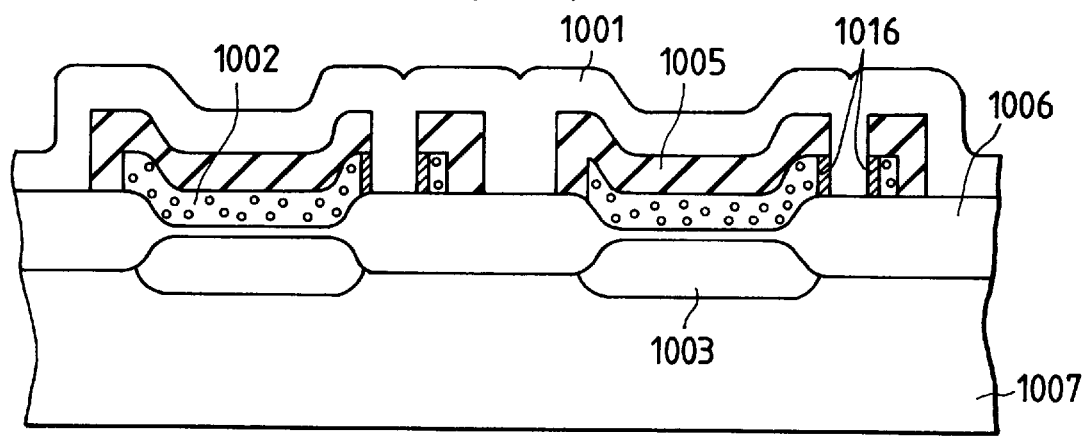

Still another example is shown in FIGS. 13 and 14. FIG. 13 is a diagrammatic plan view, corresponding to FIG. 2, and FIG. 14 is a diagrammatic sectional view, corresponding to FIG. 1, as a cross section obtained by cutting FIG. 13 along 14—14 in FIG. 13. This example is arranged in such a manner that the high-resistance layer region (high-resistance region) 1016 is formed in an inner region of each floating gate 1002. By this, the floating gates 1002 can be formed in isolated patterns from each other by preliminary patterning and thereafter the surfaces thereof all can be covered by the insulating layer 1005. After that, a part of each floating gate is perforated and the high-resistance layer region 1016 is formed on the side surface of an aperture portion, thereby obtaining the memory apparatus of FIGS. 13 and 14. The fabrication process as explained in the previous examples can be applied to the steps after formation of the high-resistance layer region 1016.

Figure 15:
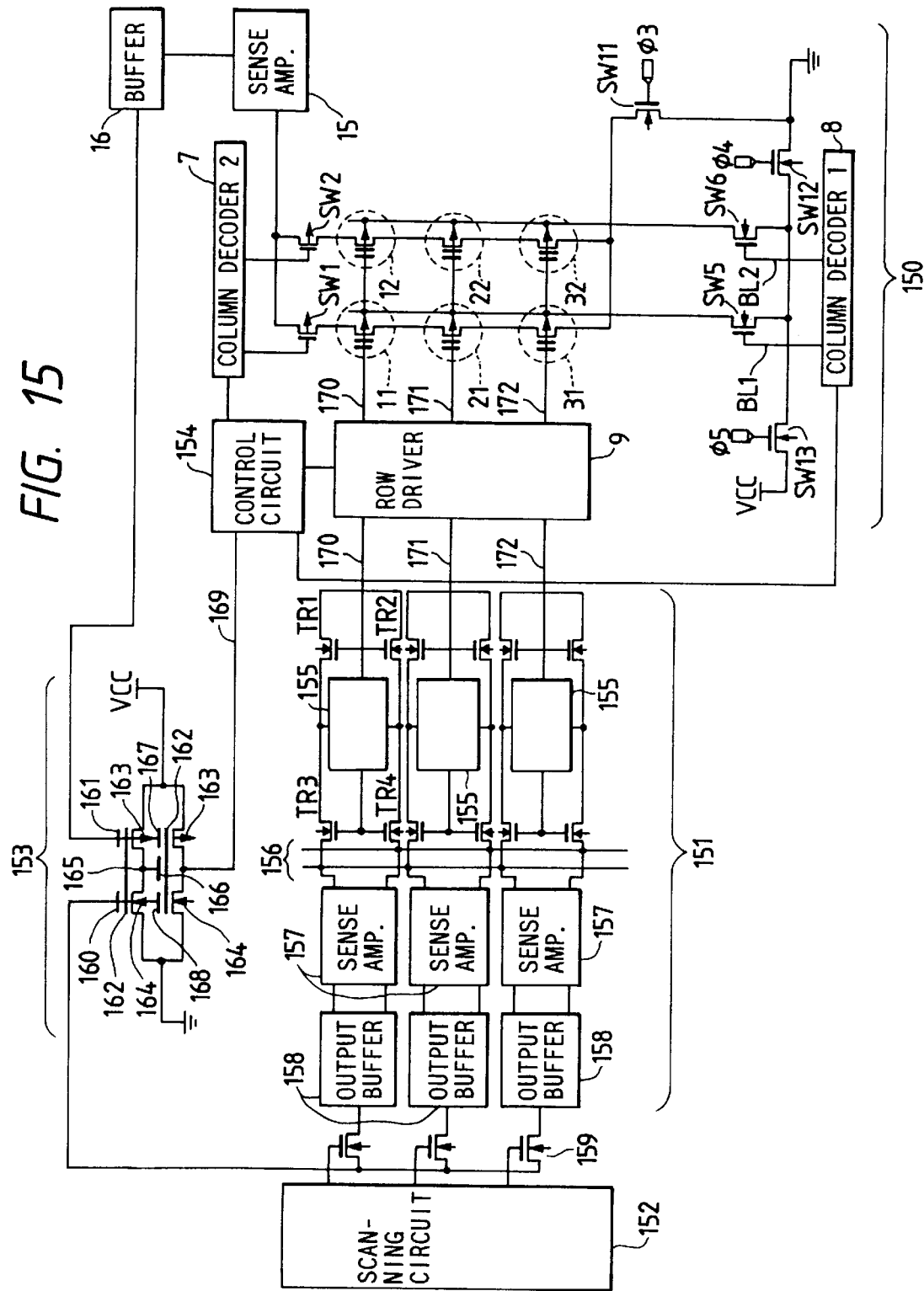

Still another example of the present invention is next explained using FIG. 15. The same portions will be denoted by the same reference numerals as those in the previous examples, and explanation thereof will be omitted. Numeral 150 designates the memory portion as described in the previous example, 151 an SRAM part, 152 a scanning circuit for sequentially reading data of SRAM out, 153 an EXOR circuit for checking whether the reading result of the memory of the present invention is correct or not, and 154 a control circuit for receiving an output from the above EXOR circuit to control the drive of the memory portion. Numeral 155 denotes CMOS-type SRAM memory cell portions, for which the p-type MOS load form is suitable because of its low dissipation power. TR1, TR2, TR3 and TR4 are MOS switches for controlling drive of SRAM memory cells, 156 denotes common data lines, 157 sense amplifiers, 158 output buffers, 159 switches for selecting outputs of the output buffers, 160, 161, 166, 167 and 168 are gates input through floating gates 162 to CMOS inverters, 163 is a p-type MOS transistor, and 164 is an n-type MOS transistor. Numeral 165 denotes an output of the first-step CMOS inverter, which is input to the gate denoted by 166 of the second-step CMOS inverter. Numeral 169 is an output of the second-step CMOS inverter, which is input to the above control circuit 154. Numerals 170, 171 and 172 are word lines, which are arranged in common to the memory cell portion of the present invention and the SRAM memory portion.

An example of the operating method of this example is next explained. Data is written in a desired column of memory 150 and the same data as in this column is also written in the cells of SRAM 151. Next, the memory of 150 is changed into the reading mode to sequentially read the data of the above column out by the sense amplifier 15. In synchronization with it, the scanning circuit 152 reads corresponding bits through the sense amplifiers 157 out of the SRAM cells, and the thus read-out outputs are input into the gate 160 of the EXOR circuit of 153. The output of the circuit denoted by 153 is at the high level when values input into the gates of 160 and 161 are different but at the low level when they are equal, whereby it can be checked whether information is correctly written in the memory portion 150 and correctly read, using the output from the circuit 153.

The EXOR circuit denoted by 153 is the CMOS circuit having multiple input gates through floating gates, which can be fabricated in the same structure as the memory region of 150 and which can perform high-functional processing with a small number of transistors. This example is arranged to execute the EXOR logic operation, but the example may be modified in such a manner that input gates of 8-bit inputs are provided through floating gates to form CMOS inverters, similar to the above example, which enables to perform majority logic of input data with two transistors (n-type MOS and p-type MOS). Using this majority logic, parity check can be done between 8-bit parity of input data and 8-bit parity of reading data.

The operation of FIG. 15 is further explained. When malfunction is confirmed through the output result of 169, the above SRAM data is again written in the next column of the memory 150. This enables to execute correction operation for correcting a writing error or a reading error.

Further, at least one bit in the data column was assigned to an error check bit for each column data, which was arranged to be checked upon reading.

The setup of FIG. 15 includes the memory of SRAM in the size corresponding to one column of the memory 150, but the size is by no means limited to this size. For example, the memory size may be increased to the level of a buffer memory, thereby enabling high-speed random access and writing. The above description concerned the example of the buffer memory of SRAM, but it is a manner of course that the above operation may be performed by setting DRAM or flash memory or the like instead on the same chip.

The setup of the example as explained above has the following advantages.

(i) The error rate is very low.

(ii) Whether writing is correct can be checked on the chip.

(iii) The above logic circuit for checking can be fabricated in the same structure as that of the memory of the invention and without adding a new process.

(iv) The above logic circuit can be constructed of a smaller number of transistors than the ordinary logic circuits, and peripheral circuits thereof can be realized in a small area, thus achieving low cost but high function.

(v) The apparatus includes the memory (SRAM, DRAM, flash memory, or the like) different from the memory structure of the present invention, thus realizing high-speed random access and writing.

Next explained is an example in which the memory apparatus of the present invention is applied to an external memory card (PC card) for personal computers etc.

Figure 16:
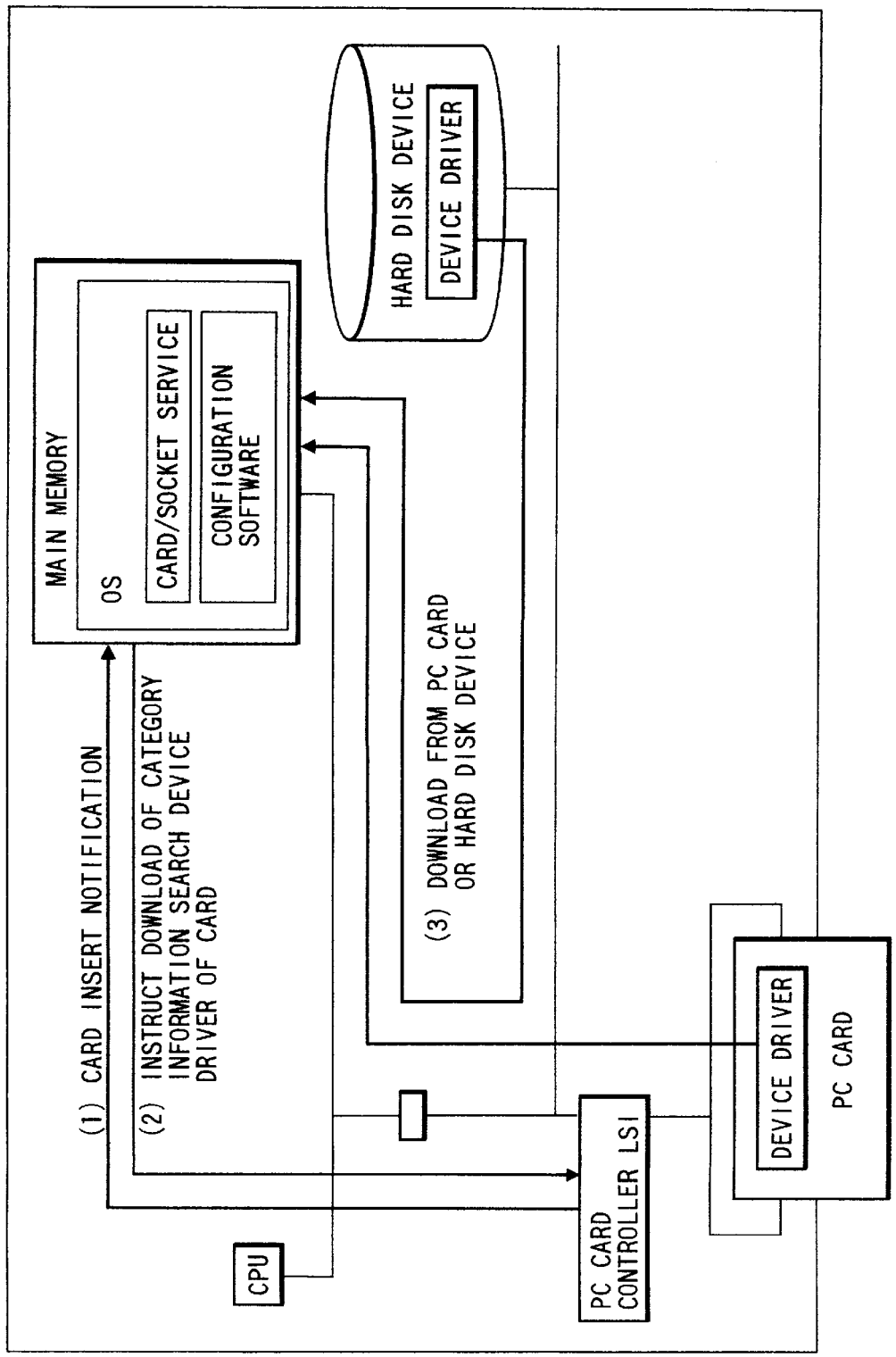
FIG. 16 is a schematic system block diagram using a PC card having the memory apparatus of the present invention.

FIG. 16 is a drawing to show a relation between the card and the system when the present invention is applied to the PC card.

In the case of PC-card-ready notebook personal computers and portable information communication devices presently available, a device driver of the PC card used is resident in the main memory. When the personal computers and the portable information communication devices are ready for plural types of PC cards, the capacity used increases for storage of the device drivers preset in the main memory portion, and some application softwares could become incapable of operating because the capacity for the drivers is too large.

The card constructed using the memory chip of the present invention permits a ROM portion to be formed on this chip. Accordingly, this card may store information on the device driver thereof and CIS (card-information-structure), which is information on the type of card, capacity, identification of card, and configuration, and it may be provided with a function to execute download in accordance with notification of card insertion of and an instruction of device driver download when the card is inserted into the main body, as shown in FIG. 16.

The interface between the card and the main body is according to the formats of PCMCIA (the canonicalization institute of United States of America) and JEIDA (Japan Electronic Industry Development Association), available for 68-pin connector, the data bus width 32 bits, the clock frequency 16 MHz, the maximum data transfer rate 60 Mbyte/s, etc.

Figure 17:
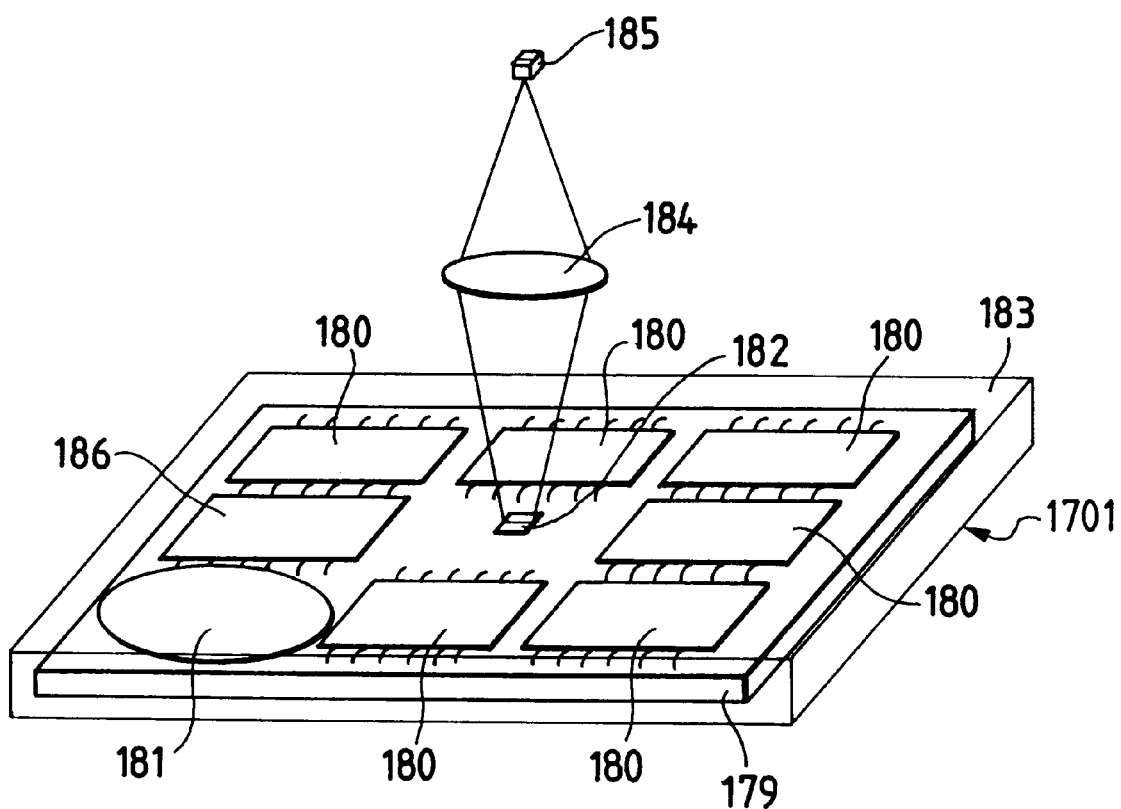
FIG. 17 is a schematic perspective view for explaining an example of IC card having the memory apparatus of the present invention.

Next to be explained, referring to FIG. 17, is an example of IC card for input and output of information with light. Numeral 180 designates the memory apparatus of the present invention, 181 a battery, 182 a semiconductor laser and a photodetector as input and output means for input and output, 186 a control circuit for controlling the memory apparatus, the laser, and the photodetector mounted on a board 179, 183 a transparent or partially transparent plastic package for protecting the foregoing devices, 184 an optical system such as a lens, and 185 a semiconductor laser and a photodetector. The IC card 1701 of the present invention is an example arranged in such a manner that the light is used for transmission of information necessary for the IC card to communicate with the outside, such as the writing data, reading data, control clock, etc., and all other operation is carried out by the control circuit 186 mounted on the board 179.

Although not clearly shown in FIG. 17, the card is desired to have an alignment mark for positioning the optical system on the board 179. When this IC card is set in a writing and reading apparatus of this card, it can be set at a desired position quickly.

This IC card has the following advantages.

(i) This card is free of the problem of contact error of connection pins and the problem of reliability of pins, different from the conventional IC cards, and has high reliability.

(ii) Since the IC card is packaged in the transparent plastic package formed by simple integral molding, it can be realized at very low cost.

(iii) The modulation frequency of semiconductor laser is high, so that input and output of information can be carried out at high bit rate and the power can be decreased.

A memory apparatus may be arranged to include a programmable logic array constructed in such an arrangement that the first polySi layer forming the floating gates and the second polySi layer forming the word lines in the memory apparatus of the present invention are arranged in a matrix, many AND circuits and OR circuits are arranged, a logic may be freely set in accordance with a use purpose of each user by changing regions between the lines at intersecting points of the matrix from the high-resistance state into the low-resistance state so as to substantially connect the lines to each other. The portions to be changed into the low-resistance state between the lines can be changed into the low-resistance state by applying a bias to the lines arranged in the matrix.

When this programmable logic array is built in the memory apparatus, any operation according to the user's specifications can be realized without change of mask, which can further decrease the cost and which can reduce the supply period to user.

The memory apparatus of the present invention can have a larger capacity and a smaller cell area per bit and can be produced at lower cost, and the writing information is permanent and stable, as compared with the conventional semiconductor memory apparatus. The memory apparatus of the present invention can operate at lower dissipation power, can be driven by a low voltage, can retain storage without a battery, and has high reliability, the drive method thereof is easy, and the operability is excellent. Further, the memory apparatus of the present invention permits high-speed writing and reading, can operate at low error rate, and can operate under wide environmental conditions. In addition, the memory apparatus of the present invention can be fabricated in short fabrication steps, at high yield, and at lower cost. Moreover, the memory apparatus of the present invention permits a memory apparatus of another method, a logic circuit, etc., to be integrated on the same chip, thus achieving further higher functionalization of chip. The memory apparatus of the present invention can be used not only as memory apparatus for computers popularly used, but also as information memory media for example for audio or video data, and can be used in place of the audio tapes, video tapes, CD-ROM, etc., commercially available at present. It can be preferably applicable to a system which permits the user readily to carry or to extract and store necessary data such as image data by writing in a recording medium such as a card having the memory apparatus of the present invention outputs from the external memory apparatus of portable devices, electronic publishing, controlling apparatus, electronic video and image memory, for example, from still videos, FAX, and copiers.

It should be noted that the present invention is not intended to be limited to the examples explained above, but the present invention can have various modifications and arrangements in the scope of the spirit of the invention.

What is claimed is:

1. A memory apparatus having a memory element which comprises:
    a substrate, a first semiconductor region of a first conduction type, said first semiconductor region forming a channel,
    second and third semiconductor regions as source and drain regions of a conduction type opposite to said first conduction type arranged to form therebetween a gap in which said first semiconductor region is disposed,
    a first electrode provided as a floating gate above said first semiconductor region on a first insulating layer in said gap between said second third semiconductor regions, and
    a second electrode provided as a control gate on a second insulating layer above said first electrode, wherein
    said memory element has a region section arranged in contact with said first electrode at a side face of said first electrode or a side face of an opening formed in said first electrode along a longitudinal direction of the channel between said second and third semiconductor region,
    an upper surface of said region section is covered with an insulating layer, and
    separate from said first and second insulating layers, an additional region section provides that electrical continuity can be established between said first and second electrodes.

2. The memory apparatus according to claim 1, wherein said region section is provided at a side face of said first electrodes and not on said second and third semiconductor regions.

3. The memory apparatus according to claim 1, wherein said region section comprises a material having silicon atoms and at least one of oxygen atoms or nitrogen atoms.

4. The memory apparatus according to claim 1, wherein said region section comprises a material having silicon atoms, oxygen atoms, and nitrogen atoms.

5. The memory apparatus according to claim 1, wherein a thickness of said region section interposed between said first electrode and said second electrode is in the range of 10 Å to 300 Å.

6. The memory apparatus according to claim 1, wherein a thickness of said region section interposed between said first electrode and said second electrode is in the range of 30 Å to 200 Å.

7. The memory apparatus according to claim 1, wherein a thickness of said region section interposed between said first electrode and said second electrode is in the range of 50 Å to 150 Å.

8. The memory apparatus according to claim 1, wherein said region section comprises an insulating material containing tantalum (Ta).

9. The memory apparatus according to claim 8, wherein said insulating material comprises tantalum oxide.

10. The memory apparatus according to claim 1, wherein said first electrode comprises a polysilicon.

11. The memory apparatus according to claim 10, wherein said polysilicon contains a metal.

12. The memory apparatus according to claim 11, wherein said metal is a high-melting-point metal.

13. The memory apparatus according to claim 12, wherein said first electrode comprises a high-melting-point metal.

14. The memory apparatus according to claim 12, wherein said first electrode contains at least one metal selected from the group consisting of tungsten, titanium, tantalum, and molybdenum.

15. The memory apparatus according to claim 11, wherein said metal is at least one selected from the group consisting of tungsten, titanium, tantalum, and molybdenum.

16. The memory apparatus according to claim 1, wherein said region section is formed by at least one of an oxide or a nitride of said first electrode.

17. The memory apparatus according to claim 16, wherein said first electrode comprises a polysilicon.

18. The memory apparatus according to claim 17, wherein said polysilicon contains at least one metal selected from the group consisting of tungsten, titanium, tantalum, and molybdenum.

19. The memory apparatus according to claim 16, wherein said first electrode comprises a high-melting-point metal.

20. The memory apparatus according to claim 16, wherein said first electrode contains at least one metal selected from the group consisting of tungsten, titanium, tantalum, and molybdenum.

21. The memory apparatus according to claim 16, wherein said first electrode comprises at least one of a silicide and a polysilicide.

22. The memory apparatus according to claim 1, wherein said first electrode comprises polysilicon.

23. The memory apparatus according to claim 22, wherein said polysilicon contains at least one metal selected from the group consisting of tungsten, titanium, tantalum, and molybdenum.

24. The memory apparatus according to claim 1, wherein said first electrode comprises a high-melting-point metal.

25. The memory apparatus according to claim 1, wherein said first electrode contains at least one metal selected from the group consisting of tungsten, titanium, tantalum, and molybdenum.

26. The memory apparatus according to claim 1, wherein said first electrode comprises at least one material selected from the group consisting of a silicide and a polysilicide.

27. The memory apparatus according to claim 1, wherein a value of a main capacitance formed between said first electrode and said second electrode is dependent upon a thickness of the first electrode.

28. The memory apparatus according to claim 1, wherein said region section is arranged to cover an entire side surface of said aperture formed in said first electrode, and at least a part of said second electrode.

29. The memory apparatus according to claim 1, further comprising a plurality of said memory elements.

30. The memory apparatus according to claim 29, wherein the second or third semiconductor region of the i-th memory element out of said plurality of memory elements is electrically connected with the third or second semiconductor region of the (i+1)-th memory element.

31. The memory apparatus according to claim 29, wherein said memory elements are arranged in a matrix.

32. The memory apparatus according to claim 31, wherein lines are provided for connecting the second electrodes in common in one direction of arrangement of said memory elements arranged in a matrix, the first semiconductor regions of said memory elements arranged in a second direction different from the one direction crossing the memory element array common to said lines are provided continuously between said memory elements arranged in the second direction, and the first semiconductor regions of each array of the memory elements arranged in the second direction are electrically separated from each other.

33. The memory apparatus according to claim 1, wherein said substrate is a substrate having a Si layer on an insulating layer.

34. The memory apparatus according to claim 1, wherein a capacitance formed by the first electrode and a semiconductor region having said first, second, and third semiconductor regions is greater than a capacitance formed by said second electrode and said first electrode.

35. The memory apparatus according to claim 1, wherein the capacitance formed between said first electrode and said second electrode is formed by depositing the insulating layer.

36. The memory apparatus according to claim 1, wherein said first electrode comprises a material containing polycrystal Si.

37. The memory apparatus according to claim 1, wherein the insulating layer between a semiconductor region comprising said first, second, and third semiconductor regions and said first electrode comprises a film containing Si, N, and O.

38. The memory apparatus according to claim 1, further comprising a second memory element, of a structure different from the structure of the memory element defined before.

39. The memory apparatus according to claim 1, wherein said memory apparatus has a CMOS circuit as a peripheral circuit for writing and reading information into and from said memory element.

40. The memory apparatus according to claim 39, wherein said peripheral circuit is provided with a circuit having a plurality of a multi-input gate electrodes inputting signal through a floating gate at least at a part of said peripheral circuit.

41. The memory apparatus according to claim 1, wherein said first electrodes and said second electrodes are arranged in a matrix.

42. The memory apparatus according to claim 41, wherein there is provided a region for changing the resistance value between the first electrode and the second electrode at an intersecting point of said matrix from the high-resistance state into the low-resistance state.

43. The memory apparatus according to claim 1, comprising a plurality of said memory elements, wherein, in ones of said memory elements in which information is desired to be written, said first semiconductor regions are connected to a power supply, and in ones of said memory elements in which information is not desired to be written, said first semiconductor regions are kept in a floating state.

44. The memory apparatus according to claim 43, further comprising a circuit designed for operation of writing and non-writing of information carried out under the following conditions:

$$\{C_{FG}/(C_{FG}+C_{CG})\} \cdot V_1 \geq V_{BD}$$

$$\{C_{FG}/(C_{FG}+C_{CG})\} \cdot V_2 \geq V_{th}$$

$$V_2 > V_{th}$$

where $V_{BD}$ is a voltage between the first electrode and the second electrode when the resistance value between said first electrode and said second electrode changes from the high-resistance state into the low-resistance state, $V_{th}$ is a threshold value of an insulating gate type transistor formed when said second and third semiconductor regions are a main electrode region, said first semiconductor region is a control electrode region, and the first electrode is a control electrode, $C_{FG}$ is a capacitance formed between said first electrode and the first, second, and third semiconductor regions, $C_{CG}$ is a capacitance formed between the first electrode and the second electrode, and $V_1$ and $V_2$ are voltages applied to the second electrode upon writing and upon reading, respectively.

45. The memory apparatus according to claim 1, wherein a first voltage applied between the first electrode and the second electrode when information is written in the memory element is set to be greater than a second voltage applied between the first electrode and the second electrode when information is read out from said memory element.

46. The memory apparatus according to claim 1, which has, in addition to said memory element, a second memory element of a different structure from said memory element, and which has means for writing data in both said memory elements, reading both writing data out of both said memory elements, and collating reading results from the two memory elements with each other.

47. The memory apparatus according to claim 46, wherein a region for writing said collation result is formed by the first-mentioned of said memory elements.

48. The memory apparatus according to claim 46, wherein a region capable of being written according to said collation result is formed by said memory element.

49. The memory apparatus according to claim 1, further comprising input and output means for transmitting and receiving signals to and from an external device.

50. The memory apparatus according to claim 49, wherein said input and output means has a semiconductor laser and a photodetector.

51. The memory apparatus according to claim 1, further comprising a packaging, containing said memory element.

52. The memory apparatus accoreding to claim 1, wherein said region section is provided at a side surface of an aperture formed in said first electrode.

53. The memory apparatus according to claim 1, wherein said region section is arranged in contact with an entire side surface of said aperture.

* * * * *